United States Patent
Olson

(10) Patent No.: US 7,203,607 B2
(45) Date of Patent: Apr. 10, 2007

(54) SYSTEM AND METHOD FOR DETERMINING INTERGRANULAR EXCHANGE IN PERPENDICULAR RECORDING MEDIA

(75) Inventor: James Terrence Olson, Santa Cruz, CA (US)

(73) Assignee: Hitachi Global Storage Technologies, Amsterdam (NL)

( * ) Notice: Subject to any disclaimer, the term of this patent is extended or adjusted under 35 U.S.C. 154(b) by 259 days.

(21) Appl. No.: 10/987,621

(22) Filed: Nov. 12, 2004

(65) Prior Publication Data

US 2006/0103958 A1 May 18, 2006

(51) Int. Cl.
 G11B 5/66 (2006.01)
(52) U.S. Cl. .................. 702/57; 427/548; 428/831; 360/45
(58) Field of Classification Search ............. 702/57; 427/127, 548; 428/611, 827, 828, 829, 831, 428/831.2, 832.2, 836.2, 840.2, 842.8; 360/25, 360/45, 46, 59, 97.03
See application file for complete search history.

(56) References Cited

U.S. PATENT DOCUMENTS

| | | | |
|---|---|---|---|
| 6,623,875 B2 * | 9/2003 | Inomata et al. | 428/828 |
| 6,670,057 B2 * | 12/2003 | Inomata | 428/827 |
| 6,730,420 B1 * | 5/2004 | Bertero et al. | 428/831.2 |
| 7,074,508 B2 * | 7/2006 | Ajan | 428/829 |
| 2002/0064689 A1 * | 5/2002 | Yamanaka et al. | 428/694 TM |
| 2003/0049461 A1 * | 3/2003 | Inomata | 428/428 |
| 2004/0048104 A1 * | 3/2004 | Shimazawa et al. | 428/693 |
| 2004/0086753 A1 * | 5/2004 | Inomata | 428/694 TM |
| 2004/0247942 A1 * | 12/2004 | Wu et al. | 428/694 T |
| 2005/0037140 A1 * | 2/2005 | Sakawaki et al. | 427/127 |
| 2005/0048325 A1 * | 3/2005 | Ajan | 428/694 TM |
| 2005/0170103 A1 * | 8/2005 | Murao et al. | 427/548 |
| 2005/0191524 A1 * | 9/2005 | Murao et al. | 428/827 |
| 2005/0266275 A1 * | 12/2005 | Nikitin et al. | 428/831 |
| 2006/0088733 A1 * | 4/2006 | Hosoe et al. | 428/827 |
| 2006/0181799 A1 * | 8/2006 | Inomata | 360/59 |

* cited by examiner

Primary Examiner—Carol S. W. Tsai
(74) Attorney, Agent, or Firm—John L. Rogitz

(57) ABSTRACT

A method for estimating the average intergranular exchange field using measurements of major and minor hysteresis loops. The method also facilitates deshearing hysteresis loops for analysis purposes in perpendicular media. This estimation technique is especially important for modern perpendicular media because exchange plays a critical role and process control can be difficult.

17 Claims, 2 Drawing Sheets

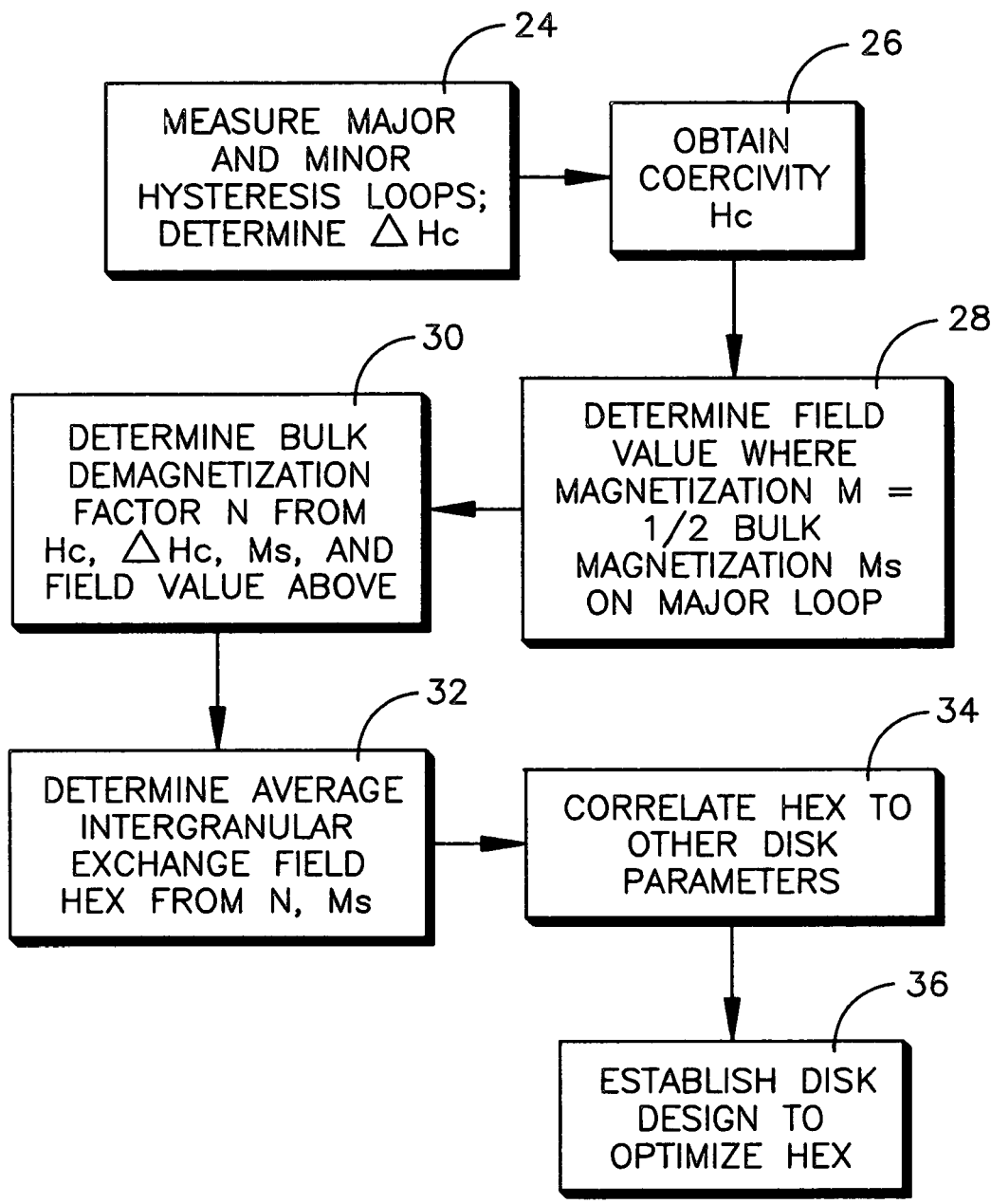

SYSTEM AND METHOD FOR DETERMINING INTERGRANULAR EXCHANGE IN PERPENDICULAR RECORDING MEDIA

FIELD OF THE INVENTION

The present invention relates generally to hard disk drives.

BACKGROUND OF THE INVENTION

The present invention critically recognizes that intergranular exchange in perpendicular recording media is one of the most important parameters to know for improving performance. As understood herein, intergranular exchange affects the media signal-to-noise by controlling the size of the crosstrack correlation length and by affecting the size of the written transition. It also affects thermal stability and adjacent track erasure. Accordingly, the present invention recognizes that it is important to know whether a particular design results in too much intergranular exchange or too little intergranular exchange.

Despite its important role in performance, the present invention further recognizes that an established method for measuring intergranular exchange has not been provided. As understood herein, the value of intergranular exchange can be used to guide designers in the direction the media should be developed, i.e., more exchange or less exchange. The value of intergranular exchange can be used to change coercivity, and it can also be used to change the slope of the hysteresis loop. Thus, as recognized herein knowing the value of intergranular exchange is useful because exchange is a key player in media performance issues such as what signal-to-noise ratio (SNR) can be expected, how thermally stable a media is, and how susceptible a data track is to erasure from writing adjacent tracks. Furthermore, the present invention recognizes that once these parametrics (SNR, thermal stability, etc.) of various disks are associated with a value for intergranular exchange, information relating to improving disk design to achieve optimal intergranular exchange can be provided.

SUMMARY OF THE INVENTION

The present invention uses a measurement technique to deduce the particle coercivity (switching field) distribution on a magnetic recording medium such as a disk in a novel way such that the intergranular exchange can be estimated. In specific embodiments the major loop of the magnetization hysteresis curve and a minor loop of the curve are measured, and a difference in field that is independent of the bulk demagnetization field is determined.

Accordingly, a method for determining an intergranular exchange field "Hex" of a magnetic recording medium having a magnetization "M" includes measuring major and minor hysteresis loops of the magnetization of the medium to obtain respective loop values. The method also includes using the loop values to determine the intergranular exchange field of the medium.

In non-limiting embodiments, the method includes determining a coercivity Hc, and a field value "H2applied" that is a field value where the magnetization "M" of the medium is one-half of a saturation magnetization value "Ms" of the medium on the major loop. A bulk demagnetization factor "N" can then be determined using the coercivity "Hc", the saturation magnetization "Ms", the field value "H2applied", and a quantity "deltaHc". The quantity "deltaHc" represents a difference in field value between predetermined points on the major and minor hysteresis loops. Mathematically, one representation of the bulk demagnetization factor is N=(H2applied-Hc-0.5*deltaHc)/ (2*pi*Ms). The intergranular exchange field "Hex" may then be estimated from the bulk demagnetization factor "N" and the saturation magnetization "Ms", e.g., Hex=4*pi*Ms*(1−N). The intergranular exchange field "Hex" can be correlated to other parameters of the medium such as signal-to-noise ratio (SNR) of the medium, thermal stability of the medium, and susceptibility of a data track to erasure from writing adjacent tracks, and the design of the medium optimized by considering the correlations of the intergranular exchange field "Hex" to the parameters.

In another aspect, a method for designing a perpendicular recording medium includes determining at least one intergranular exchange field, and based at least in part on the field, establishing a design of the medium.

In still another aspect, a method for estimating an intergranular exchange field "Hex" of a perpendicular recording disk having a magnetization "M" includes obtaining values representing major and minor hysteresis loops of the disk. The method also includes using the values to estimate the intergranular exchange field, and then establishing a design of the disk based at least in part on the intergranular exchange field.

The details of the present invention, both as to its structure and operation, can best be understood in reference to the accompanying drawings, in which like reference numerals refer to like parts, and in which:

BRIEF DESCRIPTION OF THE DRAWINGS

FIG. 2 is a flow chart of the present logic.

DETAILED DESCRIPTION

Figure 1:
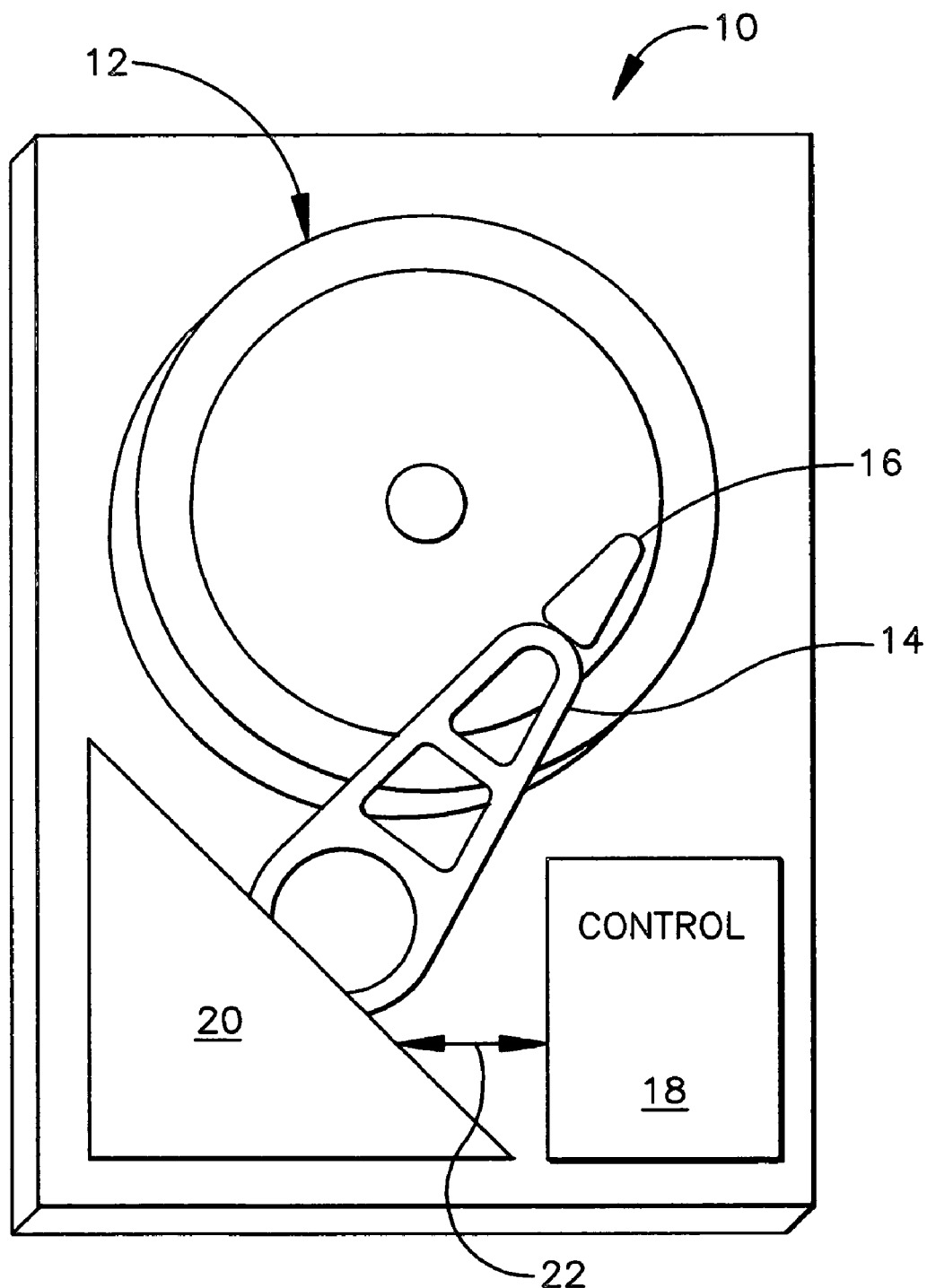
FIG. 1 is a perspective view of an exemplary embodiment of the present magnetic storage device, configured as a hard disk drive, with portions of the housing broken away.

Referring initially to FIG. 1, a magnetic data storage device is shown, generally designated 10, for storing data on a perpendicular recording storage medium 12 that in one embodiment may be implemented by plural storage disks in a hard disk drive (HDD). When implemented as a hard disk drive, the device 10 includes an arm 14 having a read/write head 16 (part of what is colloquially referred to as a "slider") on the end thereof in accordance with hard disk drive principles. The data storage region 12 may be managed by a controller 18 that can be a conventional hard disk drive controller implemented as a chip and modified per the logic below. The controller 18 controls an electromechanical actuator 20 by sending signals over a path 22 in accordance with principles known in the art to read data from and to write data to the disks 12.

Now referring to FIG. 2, the present logic can be seen. Commencing at block 24, the major and minor hysteresis loops of the magnetization of the disk 16 are measured in accordance with principles well known in the art. I. Tagawa and Y. Nakamura, IEEE Trans. Magn., vol. 27, no. 6, pp. 4975–4977 (1991), incorporated herein by reference, disclose a way to estimate the width of the switching field distribution using a measurement of the major and minor loops. Instead of using the loops for the purpose envisioned by Tagawa et al., however, the present logic moves to block 26 to use the measurement of major and minor loops to obtain the disk coercivity Hc, which is one of the parameters measured at block 24, to deshear the major loop if desired and more importantly to estimate the intergranular exchange, referred to herein as "Hex", in cooperation with the remaining method steps set forth herein.

More particularly, the logic moves to block 28 to determine a field value "H2applied" that is a field value where the magnetization "M" of the disk 16 is one-half the saturation magnetization value "Ms" (a known parameter of the disk 16) on the sheared major loop (measured at block 24) of the hysteresis curve. Next, moving to block 30 the bulk demagnetization factor "N" is obtained using the coercivity "Hc", the saturation magnetization "Ms", the field value "H2applied", and a quantity "deltaHc", which is the difference in field between the M=Ms/2 points on the major and minor loops as determined from the measurement in block 24. Thus, the quantities "H2applied", "Hc", and "deltaHc" come from measuring the major and minor hysteresis loops at block 24.

If desired, the present method can use different minor loops to probe different areas of the switching field distribution, or even use average field differences at different fractions of the saturation magnetization "Ms" between the major and minor loops. For simplicity it is disclosed how to estimate the average intergranular exchange field and, if desired, deshear the major loop, it being understood that extensions of the calculations below to more elaborate permutations of the method are straightforward and are encompassed by this invention.

Accordingly, and with more specificity regarding the process at block 30, assuming that the switching field distribution is symmetric about the coercivity Hc, N=(H2applied-Hc-0.5*deltaHc)/(2*pi*Ms). Proceeding to block 32, the average intergranular exchange field Hex can then be estimated from the bulk demagnetization factor "N" and the saturation magnetization "Ms" as follows: Hex=4*pi*Ms*(1−N). These equations assume units in centimeter-gram-seconds, and electromagnetic units.

Note that this approximation for the intergranular exchange field "Hex" and the bulk demagnetization factor "N" is accurate for moderately small values of exchange and/or symmetric switching-field distributions. For larger values of exchange and/or asymmetric switching-field distributions the error in the approximations will increase. This is partially due to coherent switching mechanisms that are unaccounted for as well as differences between the "sheared" and "desheared" switching field distributions. If the saturation magnetization "Ms" and the switching field distribution do not change substantially between media, then the difference in field "deltaHc" monotonically decreases with increasing exchange, so even if quantitative accuracy is lost in large exchange regimes it is still possible to qualitatively rank the exchange within media based on the deltaHc values.

The following table illustrates some calculations using a detailed energy-barrier switching media model in which exchange and demagnetizing interactions are calculated on a grain-by-grain basis, and is useful for improving the estimations provided by the equations above. The difference in fields "delta Hc" is calculated by simulating major and minor loops. The "Hex/Hk deltaHc method" row is derived using the difference in fields "deltaHc" from simulations of the equations presented above. The below table illustrates the expected accuracy by the approximations:

| Hex/Hk in model | 0 | 0.09 | 0.18 | 0.37 |
| Hex/Hk deltaHc method | 0.046 | 0.12 | 0.18 | 0.24 |
| Delta Hc [Oe] | 2080 | 1950 | 1750 | 1280 |

Proceeding to block 34, if desired the intergranular exchange "Hex" may be correlated by empirical observation to other disk parameters, such as but not limited to the signal-to-noise ratio (SNR) of the disk, the thermal stability of the disk, and the susceptibility of a data track to erasure from writing adjacent tracks. The disk design can be optimized at block 36 by considering the correlations of the intergranular exchange "Hex" to the noted parameters. Accordingly, as recognized herein the approximations above can be improved even further by calibrating against modeling results, such as those presented in the first row of the above table.

As mentioned above, deshearing may also be determined as an additional by-product of the present method. When the hysteresis loop is measured, the magnetization versus an applied external field is measured. This loop is called "sheared" because the slope of its side is not as steep as when it is "desheared". A loop is desheared by plotting magnetization versus the total field (applied external+demagnetization field+exchange field). Thus, to deshear a loop, the demagnetization field (which is a standard known calculation) and the exchange field must be known. Accordingly, once the exchange field "Hex" is known, the major loop can be "desheared" using the equation above. As understood herein, knowing the desheared loop indicates how the magnetization is responding to all of the fields involved, rather than just the applied field. One non-limiting use of the desheared loop is that its slope at H He can be used to estimate the width of magnetic transitions between bits.

While the particular SYSTEM AND METHOD FOR DETERMINING INTERGRANULAR EXCHANGE IN PERPENDICULAR RECORDING MEDIA as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A method for determining an intergranular exchange field "Hex" of a magnetic recording medium having a magnetization "M", comprising:

measuring major and minor hysteresis loops of the magnetization of the medium to obtain respective loop values;

determining a coercivity Hc, and a field value "H2applied" that is a field value where the magnetization "M" of the medium is one-half of a saturation magnetization value "Ms" of the medium on the major loop;

using the loop values, determining the intergranular exchange field of the medium; and using the intergranular exchange field to establish at least one of: the coercivity of the medium, or a slope of at least one of the hysteresis loops.

2. The method of claim 1, comprising determining a bulk demagnetization factor "N" using the coercivity "Hc", the saturation magnetization "Ms", the field value "H2applied", and a quantity "deltaHc", which represents a difference in field value between predetermined points on the major and minor hysteresis loops.

3. The method of claim 2, wherein:

$$N=(H2applied-Hc-0.5*deltaHc)/(2*pi*Ms).$$

4. The method of claim 3, wherein the intergranular exchange field "Hex" is estimated from the bulk demagnetization factor "N" and the saturation magnetization "Ms".

5. The method of claim 4, wherein Hex=4*pi*Ms*(1−N).

6. The method of claim 1, comprising correlating the intergranular exchange field "Hex" to other parameters of the medium.

7. The method of claim 6, wherein the other parameters include at least one of: signal-to-noise ratio (SNR) of the medium, thermal stability of the medium, and susceptibflity of a data track to erasure from writing adjacent tracks.

8. The method of claim 7, comprising optimizing design of the medium by considering the correlations of the intergranular exchange field "Hex" to the parameters.

9. A method for designing a perpendicular recording medium, comprising:

determining at least one intergranular exchange field;

determining a coercivity Hc, and a field value "H2applied" that is a field value where the magnetization "M" of the medium is one-half of a saturation magnetization value "Ms" of the medium on a major hysteresis loop associated with the medium; and based at least in part on the field, establishing at least one of: the coercivity of the medium, or a slope of at least one hysteresis loop associated with the medium.

10. The method of claim 9, wherein the medium has a magnetization "M", and the method includes:

measuring major and minor hysteresis loops of the magnetization of the medium to obtain respective loop values; and using the loop values, determining the intergranular exchange field of the medium.

11. The method of claim 9, comprising determining a bulk demagnetization factor "N" using the coercivity "Hc", the saturation magnetization "Ms", the field value "H2applied", and a quantity "deltaHc", which represents a difference in field value between predetermined points on the major and minor hysteresis loops.

12. The method of claim 11, wherein:

$$N=(H2applied-Hc-0.5*deltaHc)/(2*pi*Ms).$$

13. The method of claim 12, wherein the intergranular exchange field is estimated from the bulk demagnetization factor "N" and the saturation magnetization "Ms".

14. The method of claim 10, comprising correlating the intergranular exchange field to other parameters of the medium.

15. The method of claim 14, wherein the other parameters include at least one of: signal-to-noise ratio (SNR) of the medium, thermal stability of the medium, and susceptibility of a data track to erasure from writing adjacent tracks.

16. The method of claim 9, comprising estimating a desheared hysteresis loop using a value representing the intergranular exchange field.

17. A method for estimating a width between magnetic transitions on a perpendicular recording disk having a magnetization "M", comprising:

obtaining values representing major and minor hysteresis loops of the disk;

using the values to estimate the intergranular exchange field;

estimating a desheared hysteresis loop using a value representing the interganular exchange field; and using the desheared loop to estimate a width of magnetic transitions between bits stored on the disk as an indication of data capacity of the disk.

* * * * *